(12) United States Patent
Cho

(10) Patent No.: US 9,196,656 B2
(45) Date of Patent: Nov. 24, 2015

(54) NONVOLATILE MEMORY DEVICES

(71) Applicant: SK HYNIX INC., Icheon (KR)

(72) Inventor: Kwang Hee Cho, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/292,728

(22) Filed: May 30, 2014

(65) Prior Publication Data

US 2015/0187842 A1    Jul. 2, 2015

(30) Foreign Application Priority Data

Dec. 26, 2013  (KR) .................. 10-2013-0164329

(51) Int. Cl.
*H01L 27/24* (2006.01)
*H01L 43/10* (2006.01)
*H01L 27/22* (2006.01)
*H01L 45/00* (2006.01)

(52) U.S. Cl.
CPC ............ *H01L 27/2463* (2013.01); *H01L 45/04* (2013.01); *H01L 45/085* (2013.01); *H01L 45/12* (2013.01); *H01L 45/1233* (2013.01); *H01L 45/1273* (2013.01); *H01L 45/143* (2013.01); *H01L 45/146* (2013.01); *H01L 45/147* (2013.01); *H01L 45/1666* (2013.01)

(58) Field of Classification Search
CPC . H01L 45/146; H01L 45/143; H01L 45/1253; H01L 27/2463; H01L 27/224; H01L 43/10
See application file for complete search history.

(56) References Cited

U.S. PATENT DOCUMENTS

| | | | | |
|---|---|---|---|---|
| 8,178,875 | B2 * | 5/2012 | Kiyotoshi | 257/41 |
| 2008/0296653 | A1 * | 12/2008 | Ozawa et al. | 257/316 |
| 2009/0289290 | A1 * | 11/2009 | Huang et al. | 257/300 |
| 2013/0037897 | A1 | 2/2013 | Sun et al. | |
| 2014/0225179 | A1 * | 8/2014 | Aoyama | 257/316 |

FOREIGN PATENT DOCUMENTS

KR    10-2004-0007878 A    1/2004

* cited by examiner

*Primary Examiner* — Whitney T Moore

(57) ABSTRACT

A nonvolatile memory device includes a plurality of first electrode lines including upper portions that have convex top surfaces. A plurality of second electrode lines are disposed over the plurality of first electrode lines to cross the plurality of first electrode lines, and a plurality of memory patterns are disposed between the plurality of first electrode lines and the plurality of second electrode lines.

19 Claims, 16 Drawing Sheets

NONVOLATILE MEMORY DEVICES

CROSS-REFERENCE TO RELATED APPLICATION

The present application claims priority under 35 U.S.C 119(a) to Korean Patent Application No. 10-2013-0164329, filed on Dec. 26, 2013, in the Korean Intellectual Property Office, which is incorporated herein by reference in its entirety.

BACKGROUND

1. Technical Field

Embodiments of the present disclosure relate to nonvolatile memory devices.

2. Related Art

Various nonvolatile memory devices have been developed to implement very large scale integrated (VLSI) memory devices which are capable of storing a large amount of data and of retaining their stored data even when their power supplies are interrupted. Resistive random access memory (ReRAM) devices, magnetic random access memory (MRAM) devices, and phase changeable random access memory (PcRAM) devices have been developed to realize high performance nonvolatile memory devices. ReRAM devices (also, referred to as 'resistive memory devices') employ a variable resistive material in each of a plurality of memory cells to store data. The variable resistive material in each memory cell is disposed between a pair of electrodes. The ReRAM devices store data in their memory cells using a hysteretic resistance switching effect of the variable resistive material.

SUMMARY

Various embodiments are directed to nonvolatile memory devices and methods of manufacturing the same.

According to some embodiments, a nonvolatile memory device includes a plurality of first electrode lines including upper portions having convex top surfaces, a plurality of second electrode lines crossing the plurality of first electrode lines, and a plurality of memory patterns disposed between the first and second electrode lines.

According to further embodiments, a method of manufacturing a nonvolatile memory device includes forming a plurality of first electrode lines in a first dielectric layer on a substrate, etching upper portions of the plurality of first electrode lines to form convex top surfaces of the upper portions, forming a memory layer covering the plurality of first electrode lines, and forming a plurality of second electrode lines in a second dielectric layer on the memory layer. The plurality of second electrode lines are formed to cross the plurality of first electrode lines.

According to further embodiments, a method of manufacturing a nonvolatile memory device includes forming a plurality of first electrode lines in a first dielectric layer on a substrate, forming a memory layer covering the plurality of first electrode lines, and forming a plurality of second electrode lines in a second dielectric layer on the memory layer. The plurality of second electrode lines are formed to cross the plurality of first electrode lines. The second dielectric layer and the memory layer are etched to form memory patterns under the plurality of second electrode lines.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

It will be understood that although the terms 'first,' 'second,' 'third,' etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being "on," "above," "below," or "under" another element, it can be directly "on," "above," "below," or "under" the other element, respectively, or at least one intervening element may be present therebetween. Accordingly, the terms such as "on," "above," "below," or "under" which are used herein are for the purpose of describing particular embodiments only and are not intended to limit the present disclosure.

Figure 1:
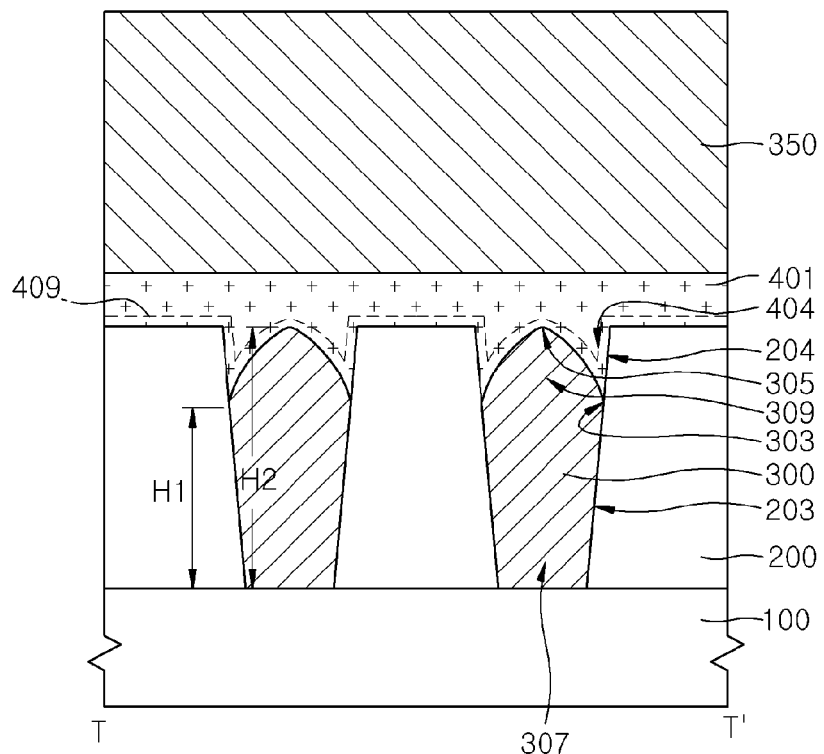
FIGS. 1 and 2 are cross-sectional views of a nonvolatile memory device according to an embodiment of the present disclosure.
Figure 2:
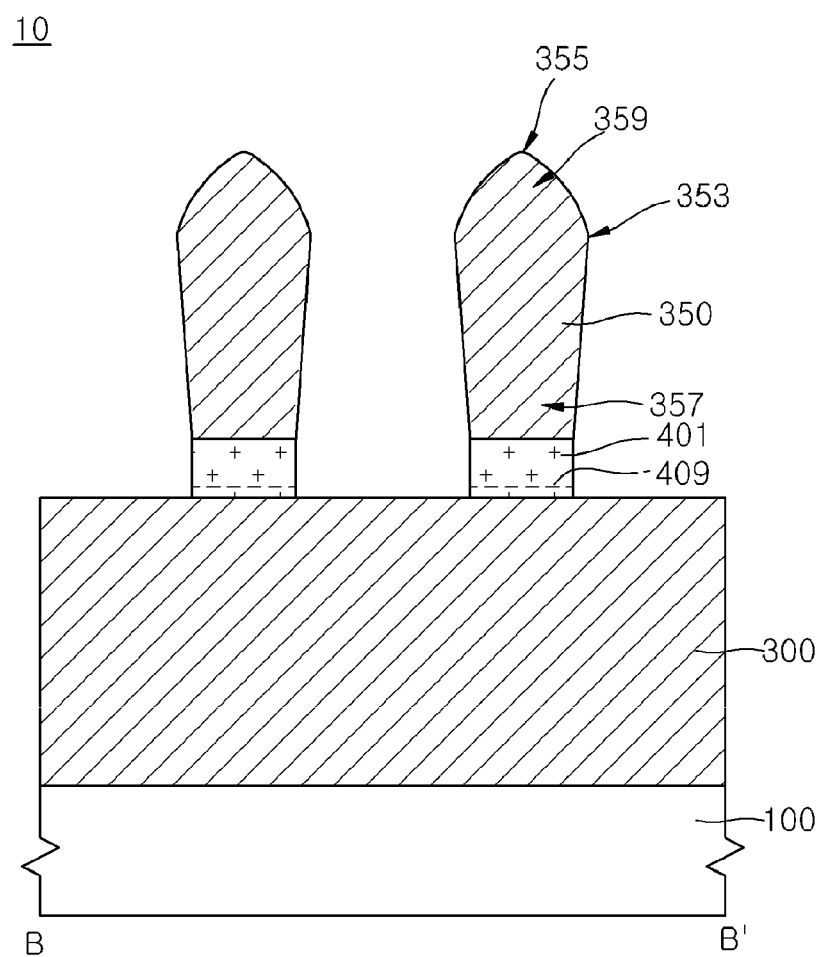

FIGS. 1 and 2 are cross-sectional views of a nonvolatile memory device 10 according to an embodiment of the present disclosure. The nonvolatile memory device 10 includes a semiconductor substrate 100, first electrode lines 300 disposed over the semiconductor substrate 100 and extending in a first direction parallel to a line B-B' (shown in FIG. 2), second electrode lines 350 disposed over the first electrode lines 300 and extending in a second direction parallel to a line T-T' (shown in FIG. 1), and memory patterns 401 disposed between the first electrode lines 300 and the second electrode lines 350 to store data therein. The first electrode lines 300 cross the second electrode lines 350 at substantially a right angle in a plan view.

The first electrode lines 300 correspond to lower electrodes, are disposed in a first dielectric layer 200, and have bar shapes. A line width of lower portions 307 of the first electrode lines 300 close to the semiconductor substrate 100 may be less than a line width of upper portions 309 of the first electrode lines 300 farther from the semiconductor substrate 100. The first dielectric layer 200 separates the first electrode lines 300 from each other to electrically insulate the first electrode lines 300 from each other. Each of the upper portions 309 of the first electrode lines 300 may have a convex top surface. That is, a height H1 of an edge portion 303 of each upper portion 309 is less than a height H2 of a central portion 305 of each upper portion 309 such that the central portion 305 upwardly protrudes as compared with the edge portion 303.

Since the upper portions 309 of the first electrode lines 300 have convex top surfaces, concave edge valleys 204 are provided between sidewalls of the first dielectric layer 200 and the central portions 305 of the first electrode lines 300. Portions of the memory patterns 401 fill the edge valleys 204 to provide curtain-shaped contact extension portions 404. Thus, contact areas between the first electrode lines 300 and the memory patterns 401 may increase as the contact extension portions 404 extend downwardly. That is, a distance along a convex top surface of each first electrode line 300 in the second direction (parallel with the line T-T') may be greater than a line width of the upper portions 309 of the first electrode lines 300. Because the contact extension portions 404 of the memory patterns 401 extend into interfacial regions between the first dielectric layer 200 and the upper portions 309 of the first electrode lines 300, distances between the upper portions 309 of adjacent first electrode lines 300 may increase due to the presence of the contact extension portions 404.

Each of the memory patterns 401 may have at least two electrical states suitable for use to store digitalized data. Each of the memory patterns 401 may include a resistance switching material, and thus the nonvolatile memory device may be a ReRAM device (also referred to as a resistive memory device). The resistance switching material may be a material whose electrical resistance value varies according to an electric field applied thereto.

In an embodiment, each of the memory patterns 401 includes a colossal magneto resistance (CMR) material or a praseodymium calcium manganese oxide ($Pr_{1-x}Ca_xMnO_3$) (referred to as a "PCMO") material. In another embodiment, each of the memory patterns 401 includes a non-stoichiometric composition of binary transition metal oxide material such as a niobium oxide, a titanium oxide, a nickel oxide, or an aluminum oxide. A nonstoichiometric composition of binary transition metal oxide material may contain a relatively excessive transition metal content as compared with a stable binary transition metal oxide material having a stoichiometric composition. The nonstoichiometric composition may be a titanium oxide ($Ti_4O_7$) material.

In other embodiments, each of the memory patterns 401 includes a chalcogenide material having an amorphous state such as is used in Ovonics switch. In still other embodiments, each of the memory patterns 401 includes a ferroelectric material (such as a strontium titanium oxide ($SrTiO_3$) material or a strontium zirconium oxide ($SrZrO_3$) material) doped with chromium (Cr) or niobium (Nb).

In still other embodiments, each of the memory patterns 401 includes a germanium selenide (GeSe) material doped with silver (Ag) having a relatively high ion mobility. The germanium selenide (GeSe) material doped with silver (Ag) may have a programmable metallization cell (PMC) structure. That is, the germanium selenide (GeSe) material doped with silver (Ag) may have two resistance states according to the presence or absence of conductive filaments generated by an electrochemical reaction.

As described above, each of the memory patterns 401 may include a resistance switching material which has two different resistance states or two different conductive states changing according to a voltage or current applied thereto.

Selection patterns 409 may be additionally disposed between the memory patterns 401 and the first electrode lines 300 or between the memory patterns 401 and the second electrode lines 350. The selection patterns 409 may provide selection elements that prevent the undesired selection of one or more of the memory patterns 401 (i.e., undesired memory cells) by a leakage current such as a sneak path current.

The selection patterns 409 may include diodes acting as switching elements. If the selection patterns 409 provide PN diodes or tunnel diodes, the selection patterns 409 may allow cell currents between the first electrode lines 300 and the second electrode lines 350 to flow only in one direction regardless of a resistance state (that is, a low resistance state (LRS) or a high resistance state (HRS)) of the memory patterns 401. If the selection patterns 409 are disposed between the memory patterns 401 and the first electrode lines 300, each memory cell of the nonvolatile memory device may correspond to a 1-Selector-1-Resistor (1S1R) memory cell including a single selector and a single resistor.

If the selection patterns 409 provide tunnel diodes, the selection patterns 409 may include a tunnel barrier layer. The tunnel barrier layer may include a transition metal oxide layer such as a titanium oxide ($TiO_2$) layer, a hafnium oxide ($HfO_2$) layer, a tantalum oxide ($Ta_2O_5$) layer, a zirconium oxide ($ZrO_2$) layer, an aluminum oxide ($Al_2O_3$) layer, or the like.

Referring to FIG. 2, the second electrode lines 350 extend in the second direction (parallel with the line T-T') crossing the first electrode lines 300 and have bar shapes. A line width of lower portions 357 of the second electrode lines 350 close to the memory patterns 401 may be less than a line width of upper portions 359 of the second electrode lines 350 farther from the memory patterns 401. Each of the upper portions 359 of the second electrode lines 350 may have a convex top surface. That is, a height of an edge portion 353 of each upper portion 359 is less than a height of a central portion 355 of each upper portion 359 such that the central portion 355 upwardly protrudes as compared with the edge portion 353. Thus, distances between the upper portions 359 of adjacent second electrode lines 350 may increase.

The second electrode lines 350 extend along the second direction to have line shapes. The second electrode lines 350 may be stacked on the memory patterns 401 such that sidewalls of the second electrode lines 350 are vertically aligned with sidewalls of the memory patterns 401.

In an embodiment, each of the first and second electrode lines 300 and 350 may include a metal material such as a copper (Cu) material or a tungsten (W) material. In another embodiment, each of the first and second electrode lines 300 and 350 may include one or more of a silver (Ag) material, a gold (Au) material, a platinum (Pt) material, an aluminum (Al) material, an indium tin oxide (ITO) material, a nickel (Ni) material, a titanium (Ti) material, and a titanium nitride (TiN) material. In some embodiments, each of the first and second electrode lines 300 and 350 may include a doped silicon material.

FIGS. 3 to 12 illustrate a process of manufacturing the nonvolatile memory device 10 according to an embodiment.

Figure 3:
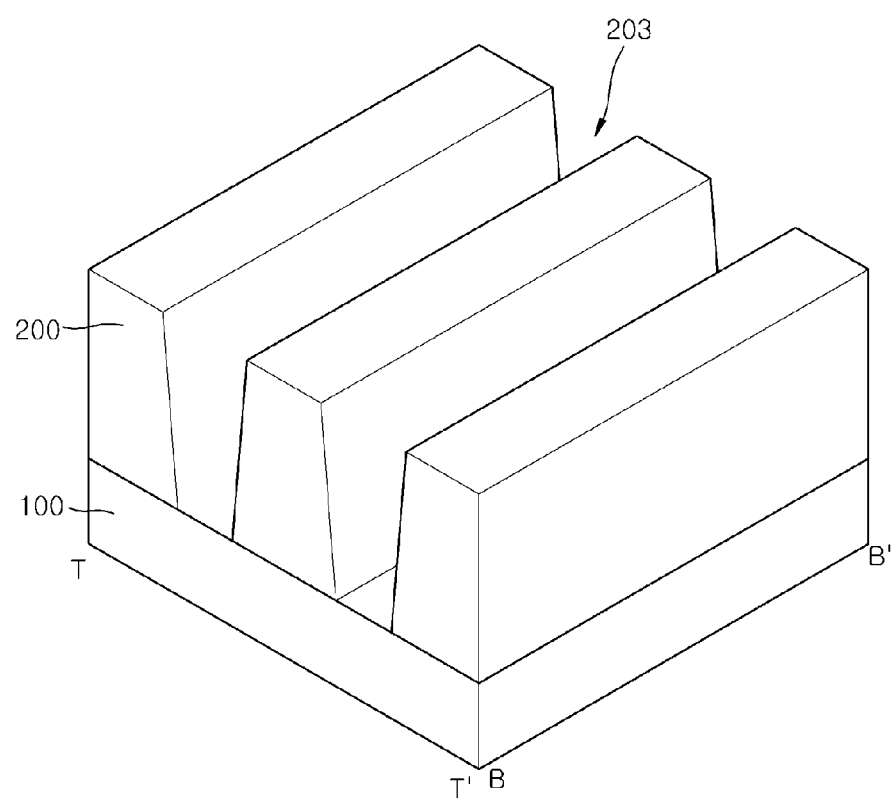
FIGS. 3 to 12 are perspective views illustrating a process of manufacturing a nonvolatile memory device according to an embodiment.

Referring to FIG. 3, a first dielectric layer 200 is formed on a substrate 100. The substrate 100 may be a semiconductor substrate including selection elements such as diodes and/or transistors. The first dielectric layer 200 may be formed of any one of various dielectric layers. In an embodiment, the first dielectric layer 200 includes a silicon oxide material.

First trenches 203 are formed in the first dielectric layer 200. The first trenches 203 may extend in a first direction which is parallel with a line B-B'. The first trenches 203 may be formed by removing portions of the first dielectric layer 200 using a photolithography process and an etch process. The first dielectric layer 200 having the first trenches 203 may be used as a template pattern in a subsequent damascene process.

The first trenches 203 may be formed by anisotropically etching the first dielectric layer 200. Thus, the first trenches 203 may have sloped sidewalls such that a lower width of each first trench 203 is less than an upper width of each first trench 203.

Figure 4:
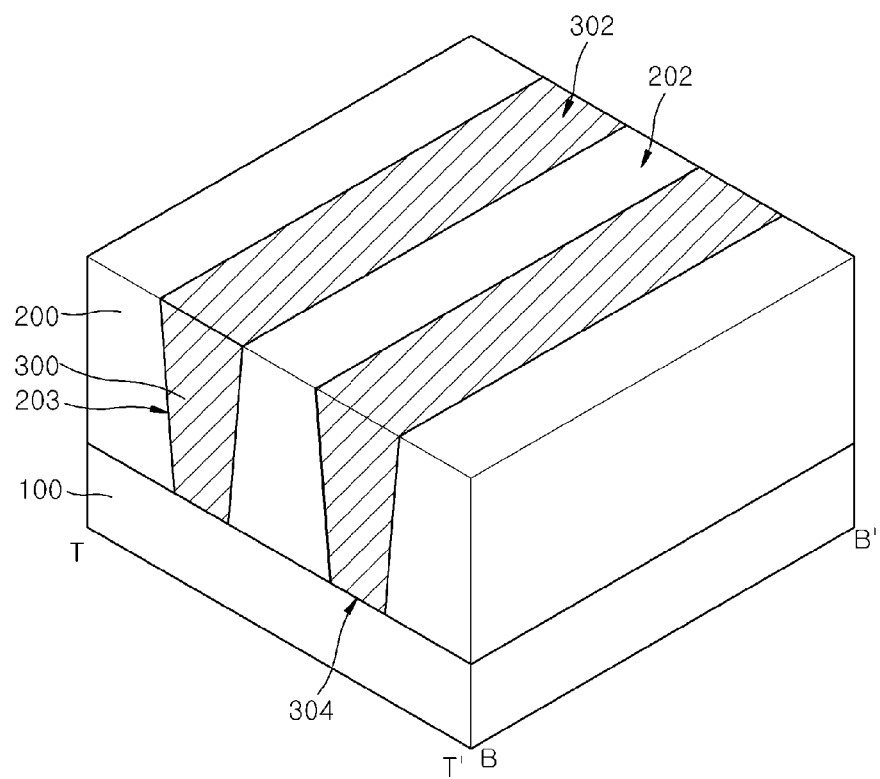

A first conductive layer may be formed over the first dielectric layer 200 to fill the first trenches 203 and cover the first dielectric layer 200. Then, as shown in FIG. 4, the first conductive layer may be planarized to expose a top surface 202 of the first dielectric layer 200. As a result of the planarization of the first conductive layer, the first conductive layer may be separated into first electrode lines 300 which are formed in respective ones of the first trenches 203.

In an embodiment, the first conductive layer may include a metal material such as a copper (Cu) material or a tungsten (W) material. In another embodiment, the first conductive layer may include one or more of a silver (Ag) material, a gold (Au) material, a platinum (Pt) material, an aluminum (Al) material, an indium tin oxide (ITO) material, a nickel (Ni) material, a titanium (Ti) material, and a titanium nitride (TiN) material. The first conductive layer may be planarized using a chemical mechanical polishing (CMP) process, and shapes of the first electrode lines 300 may be defined by the first trenches 203.

The first electrode lines 300 may initially be formed to have top surfaces 302 which are substantially coplanar with the top surface 202 of the first dielectric layer 200. The first electrode lines 300 may have sloped sidewalls such that a lower width of each first electrode line 300 is less than an upper width of each first electrode line 300.

As a result, a distance between the top surfaces 302 of adjacent first electrode lines 300 may be less than a distance between bottom surfaces 304 of the adjacent first electrode lines 300. Accordingly, when the nonvolatile memory device is scaled down, the probability of electrical shorts between the first electrode lines 300 may increase. However, this probability may be reduced as described below.

Figure 5:
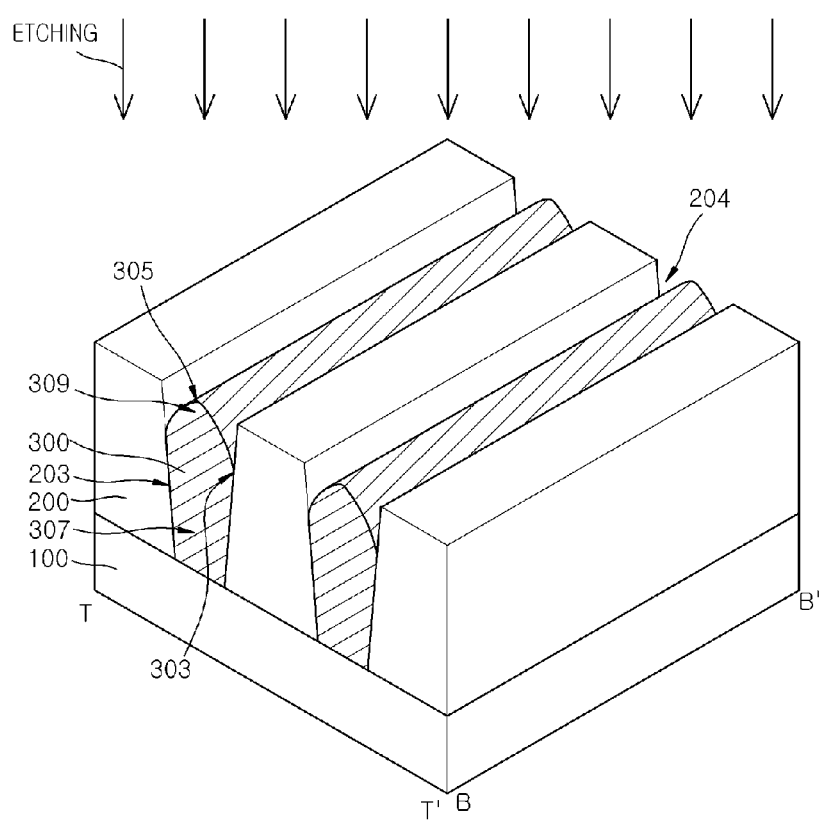

Referring to FIG. 5, an anisotropic etch process such as a reactive ion etch (RIE) process is applied to the top surfaces (302 of FIG. 4) of the first electrode lines 300 to selectively recess edge portions 303 of the first electrode lines 300. As a result, the first electrode lines 300 may be modified to have convex top surfaces. That is, as a result of the anisotropic etch process applied to the top surfaces 302 of the first electrode lines 300, central portions 305 of upper portions 309 of the first electrode lines 300 may relatively protrude as compared with the recessed edge portions 303.

The anisotropic etch process may be performed using an etch recipe which produces an etch rate of the first electrode lines 300 greater than an etch rate of the first dielectric layer 200. As a result, the first dielectric layer 200 may act as an etch mask while the anisotropic etch process is applied to the top surfaces 302 of the first electrode lines 300.

Because a chemical bonding energy between atoms of the first dielectric layer 200 and atoms of the first electrode lines 300 may be lower than a chemical bonding energy between atoms constituting the first electrode lines 300, the edge portions 303 of the first electrode lines 300 may be etched faster than the central portions 305 while the anisotropic etch process is applied to the top surfaces 302. Thus, edge valleys 204 are formed between the upper portions 309 of the first electrode lines 300 and the sidewalls of the first trenches 203 in the first dielectric layer 200.

As described above, the first electrode lines 300 are formed to have sloped sidewalls. Thus, as the edge portions 303 of the first electrode lines 300 become more etched, a width of the upper portions 309 of the first electrode lines 300 may be reduced. As a result, a distance between the upper portions 309 of adjacent first electrode lines 300 may increase.

Figure 6:
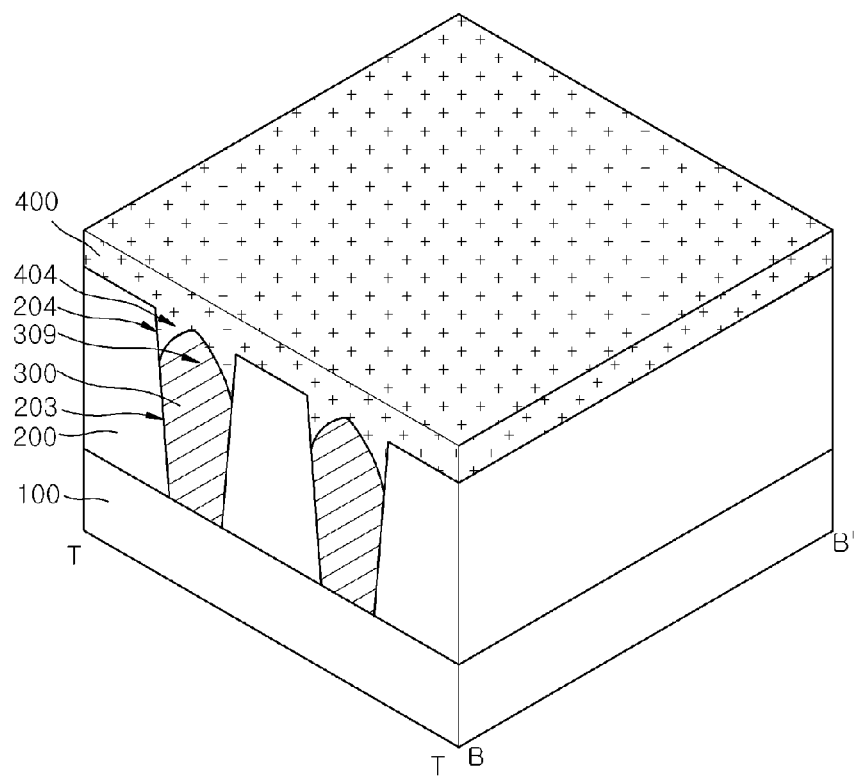

Referring to FIG. 6, a memory layer 400 is formed on the first dielectric layer 200 and the first electrode lines 300, and fills the edge valleys 204. A contact area between the memory layer 400 and the first electrode lines 300 may increase because of the presence of contact extension portions 404 filling the edge valleys 204. That is, a contact area between the memory layer 400 and the first electrode lines 300 having the convex top surfaces may be greater than a contact area that would have been formed if the memory layer 400 had directly contacted the first electrode lines 300 having the flat top surfaces 302. This may lead to an increase of an integration density of the nonvolatile memory device.

The memory layer 400 may be formed of a material having at least two resistance states changing according to a voltage or current applied thereto. That is, the memory layer 400 may be formed of a resistance switching material.

In an embodiment, the memory layer 400 may include a material whose electrical resistance value varies according to an electric field applied thereto, such as a colossal magneto resistance (CMR) material or a praseodymium calcium manganese oxide ($Pr_{1-x}Ca_xMnO_3$) (referred to as a "PCMO") material. In another embodiment, the memory layer 400 may include a binary transition metal oxide material having a non-stoichiometric composition.

In some embodiments, the memory layer 400 may include a transition metal oxide material having a nonstoichiometric composition, such as a titanium oxide ($Ti_4O_7$) material. In other embodiments, the memory layer 400 may include a chalcogenide material having an amorphous state. In still other embodiments, the memory layer 400 may include a ferroelectric material (such as a strontium titanium oxide ($SrTiO_3$) material or a strontium zirconium oxide ($SrZrO_3$) material) doped with chromium (Cr) or niobium (Nb).

In still other embodiments, the memory layer 400 may include a germanium selenide (GeSe) material doped with silver (Ag) having a relatively high ion mobility. The germanium selenide (GeSe) material doped with silver (Ag) may have a programmable metallization cell (PMC) structure. That is, the germanium selenide (GeSe) material doped with silver (Ag) may have two resistance states according to the presence or absence of conductive filaments generated by an electrochemical reaction.

As described above, the memory layer 400 may include a resistance switching material or a variable resistor formed of a non stoichiometric compositioned transition metal oxide material employed in ReRAM devices. That is, the memory layer 400 can be formed of any material having at least two different resistance states or at least two different electrical states changing according to a voltage or current applied thereto.

Figure 7:
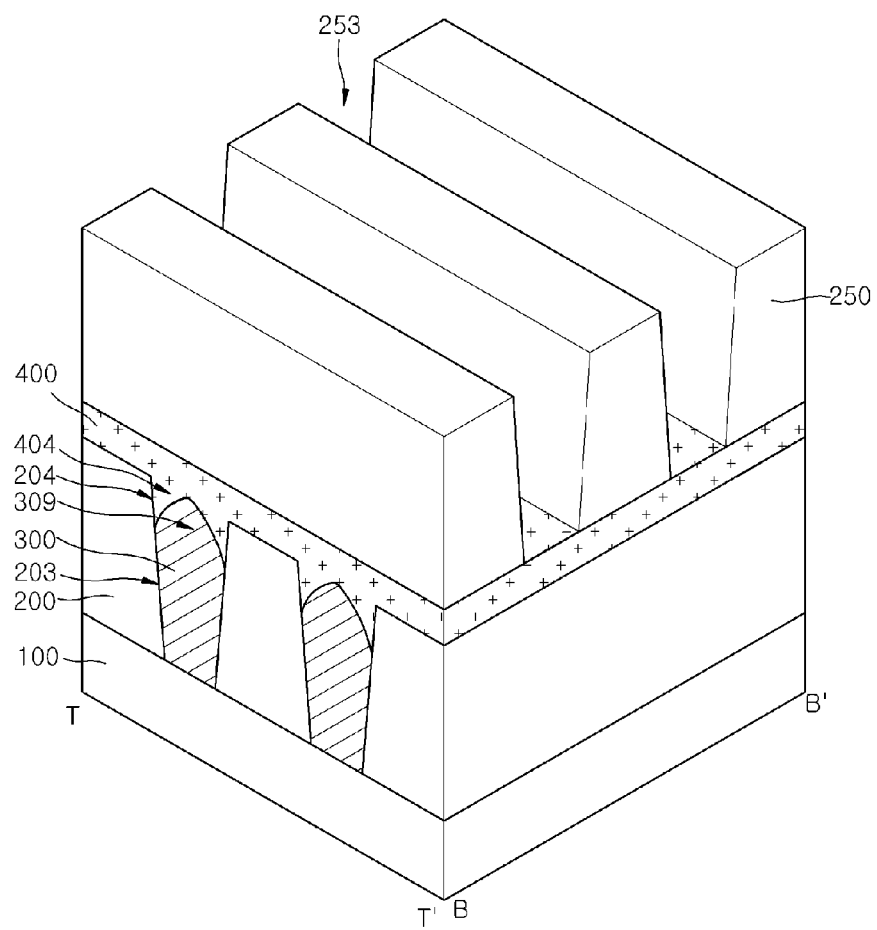

Referring to FIG. 7, a second dielectric layer 250 for use in a damascene process is formed on the memory layer 400 having a flat plate shape. The second dielectric layer 250 may be formed of any one of various dielectric layers. The second dielectric layer 250 may include a silicon oxide material.

Second trenches 253 are formed in the second dielectric layer 250. The second trenches 253 may extend in a second direction (parallel with a line T-T') which is substantially perpendicular to the first direction. That is, the second trenches 253 may be formed to cross the first electrode lines 300 at a right angle when viewed from a plan view.

The second trenches 253 may be formed by removing portions of the second dielectric layer 250 using a photolithography process and an etch process. The second dielectric layer 250 having the second trenches 253 may be used as a template pattern in a subsequent damascene process.

Figure 8:
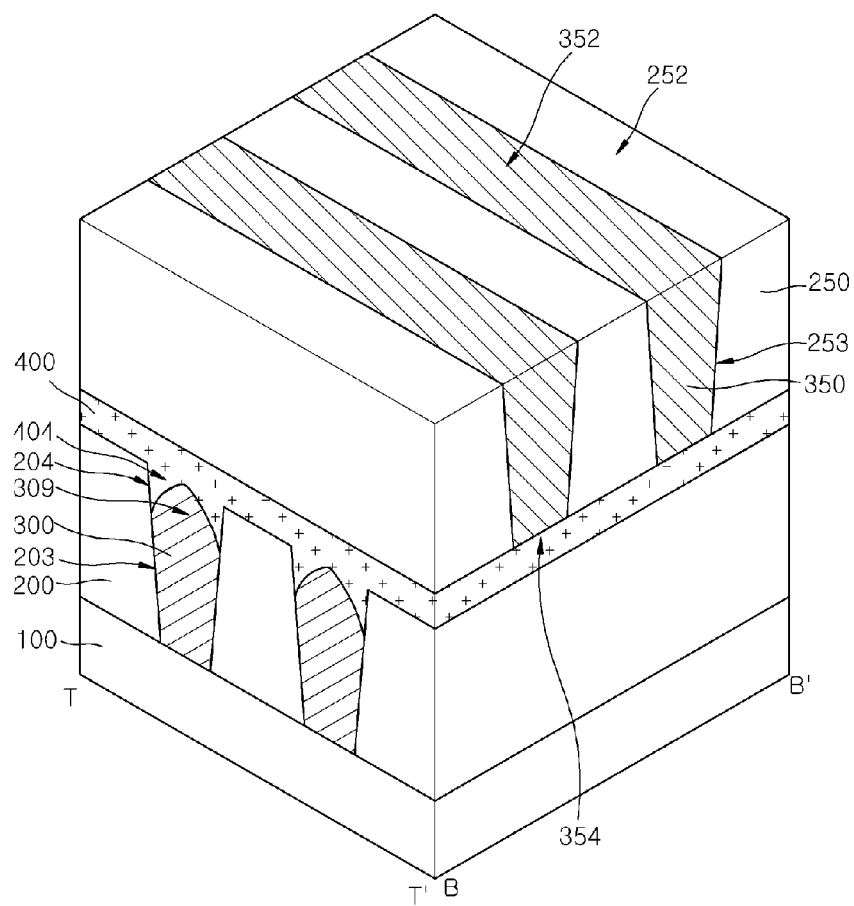

Referring to FIG. 8, a second conductive layer is formed on the second dielectric layer 250 to fill the second trenches 253, and the second conductive layer may be planarized to expose a top surface 252 of the second dielectric layer 250. As a result of the planarization of the second conductive layer, the second conductive layer may be separated into second electrode lines 350 disposed within the second trenches 253.

In an embodiment, the second conductive layer may include a metal material such as a copper (Cu) material or a tungsten (W) material. In another embodiment, the second conductive layer may include one or more of a silver (Ag) material, a gold (Au) material, a platinum (Pt) material, an aluminum (Al) material, an indium tin oxide (ITO) material, a nickel (Ni) material, a titanium (Ti) material, and a titanium nitride (TiN) material. The second conductive layer may be planarized using a chemical mechanical polishing (CMP) process, and shapes of the second electrode lines 350 may be defined by the second trenches 253.

The second electrode lines 350 may have top surfaces 352 which are substantially coplanar with the top surface 252 of the second dielectric layer 250. The second trenches 253 may be formed by anisotropically etching the second dielectric layer 250. Thus, the second trenches 253 may have sloped sidewalls such that a lower width of each second trench 253 is less than an upper width of each second trench 253. As a result, the second electrode lines 350 may have sloped sidewalls such that a lower width of each second electrode line 350 is less than an upper width of each second electrode line 350.

As a result, a distance between the top surfaces 352 of adjacent second electrode lines 350 may be less than a distance between bottom surfaces 354 of the adjacent second electrode lines 350. Accordingly, when the nonvolatile memory device is scaled down, the probability of electrical shorts between the second electrode lines 350 may increase. However, this probability may be reduced as described below.

Figure 9:
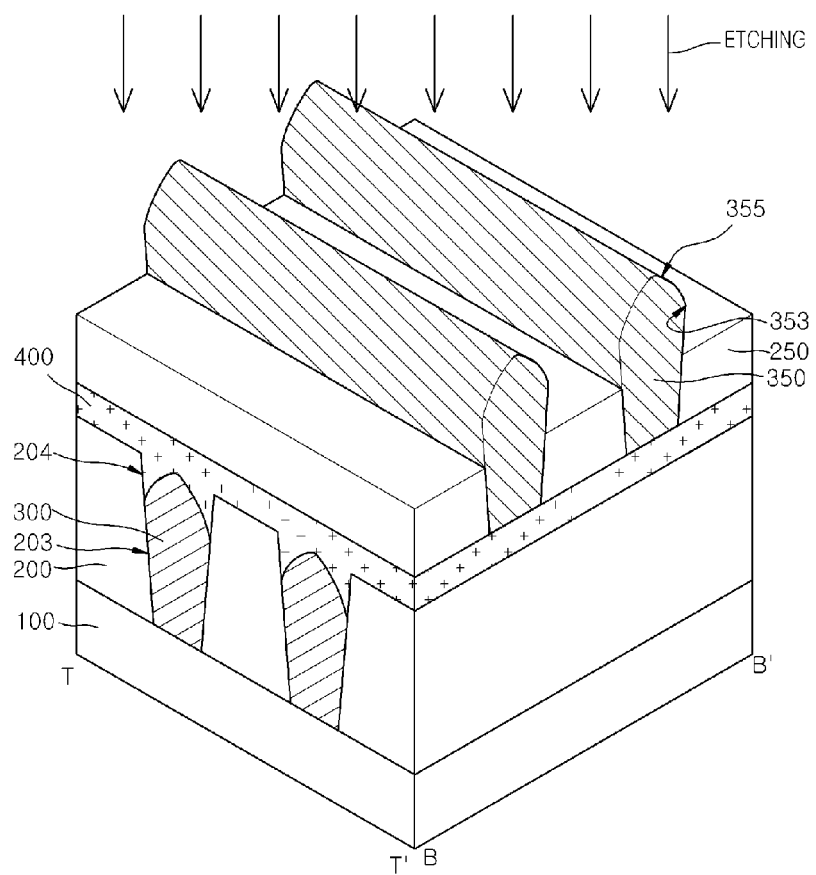

Referring to FIG. 9, an anisotropic etch process, such as a reactive ion etch (RIE) process, is applied to the second dielectric layer 250 and the second electrode lines 350. The anisotropic etch process may be performed using an etch recipe which produces an etch rate of the second dielectric layer 250 greater than an etch rate of the second electrode lines 350. Thus, as illustrated in FIG. 9, a top surface of the second dielectric layer 250 may be lowered to expose sidewalls of the second electrode lines 350.

Because a chemical bonding energy between atoms of the second dielectric layer 250 and atoms of the second electrode lines 350 may be lower than a chemical bonding energy between atoms constituting the second electrode lines 350, edge portions 353 of upper portions 359 of the second electrode lines 350 may be etched faster than central portions 355 of the upper portions 359 of the second electrode lines 350 while the anisotropic etch process is applied to the second dielectric layer 250 and the second electrode lines 350. As a result, the second electrode lines 350 may be deformed to have convex top surfaces. Accordingly, a distance between the upper portions 359 of adjacent second electrode lines 350 may increase.

Figure 10:
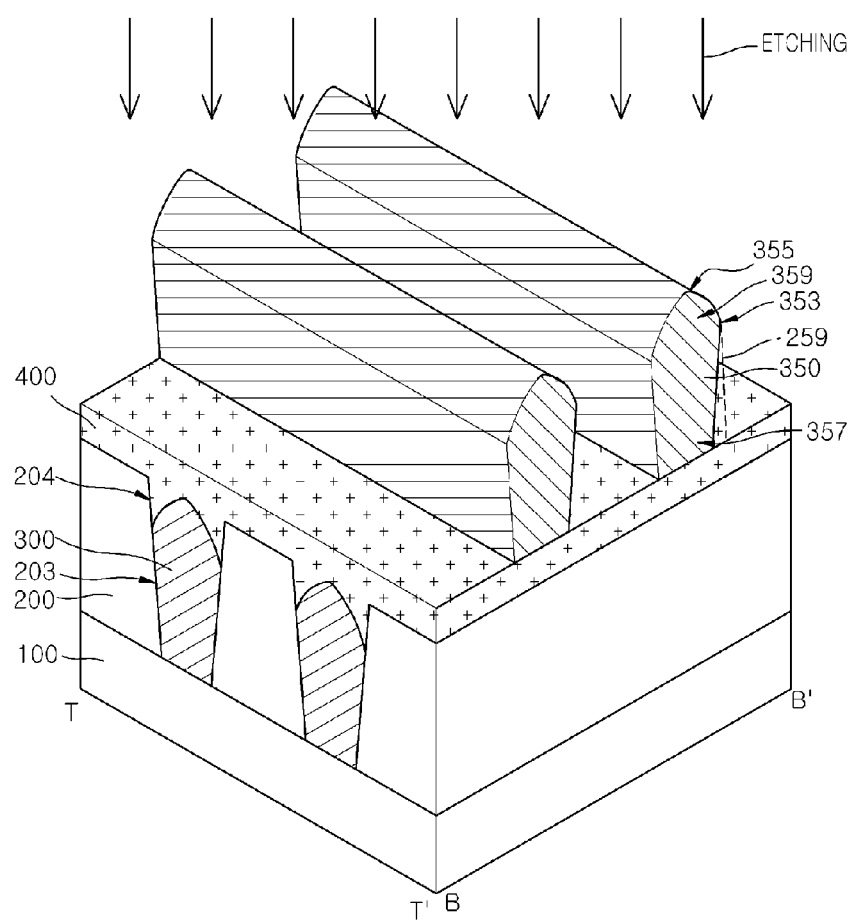

Referring to FIG. 10, the anisotropic etch process applied to the second dielectric layer 250 may expose the memory layer 400. Since the second electrode lines 350 act as etch masks during the anisotropic etch process, portions of the memory layer 400 in regions between the second electrode lines 350 may be exposed.

Portions 259 of the second dielectric layer 250 may remain on the negative sloped sidewalls of the second electrode lines 350 because of the nature of the anisotropic etch process applied to the second dielectric layer 250. That is, the portions 259 of the second dielectric layer 250 may remain on sidewalls of lower portions 357 of the second electrode lines 350.

Figure 11:
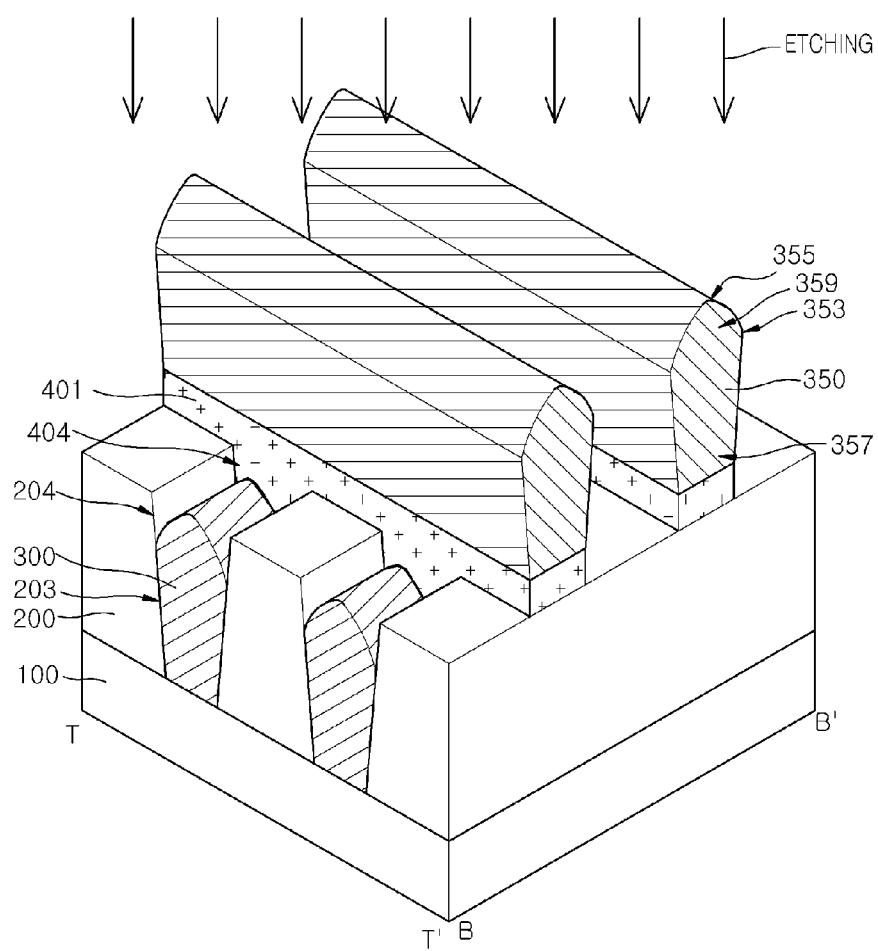

Referring to FIG. 11, the exposed portions of the memory layer 400 are etched to form memory patterns 401 remaining under the second electrode lines 350 and to expose portions of the first electrode lines 300 and portions of the first dielectric layer 200. The memory patterns 401 may extend in the second direction which is parallel with the second electrode lines 350. The memory patterns 401 may be formed by etching the memory layer 400 using the second electrode lines 350 as hard etch masks. Thus, the fabrication process may be simplified because no extra etch masks are required to form the memory patterns 401.

Figure 12:
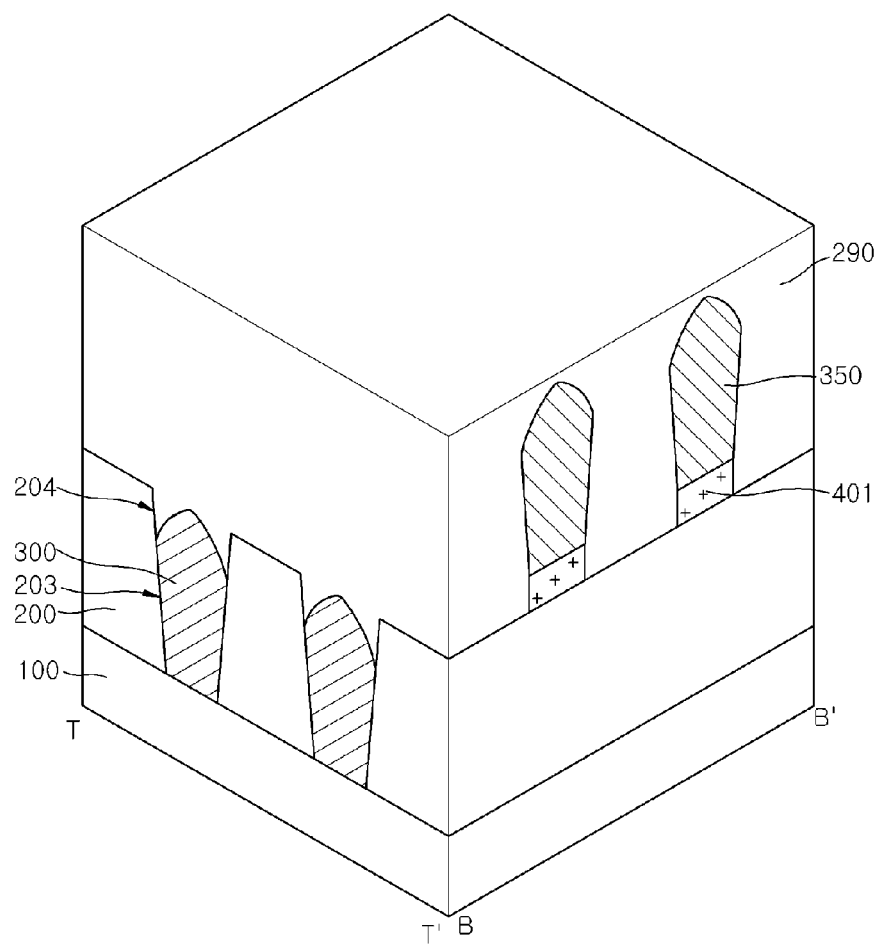

Referring to FIG. 12, a third dielectric layer 290 is formed to cover exposed portions of the first electrode lines 300 and the first dielectric layer 200 and to cover the second electrode lines 350 and the memory patterns 401. The third dielectric layer 290 may electrically insulate the second electrode lines 350 from each other and may also electrically insulate the memory patterns 401 from each other. The third dielectric layer 290 may be formed of any one of various dielectric layers.

Figure 13:
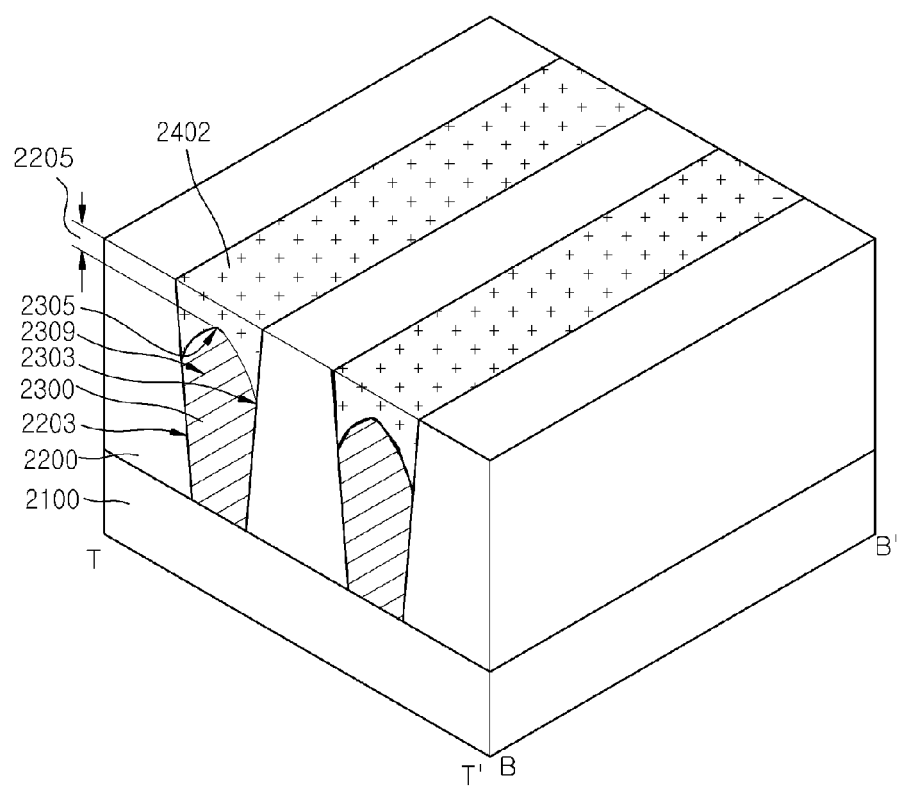
FIGS. 13, 14 and 15 are perspective views illustrating a process of manufacturing a nonvolatile memory device according to another embodiment.
Figure 14:
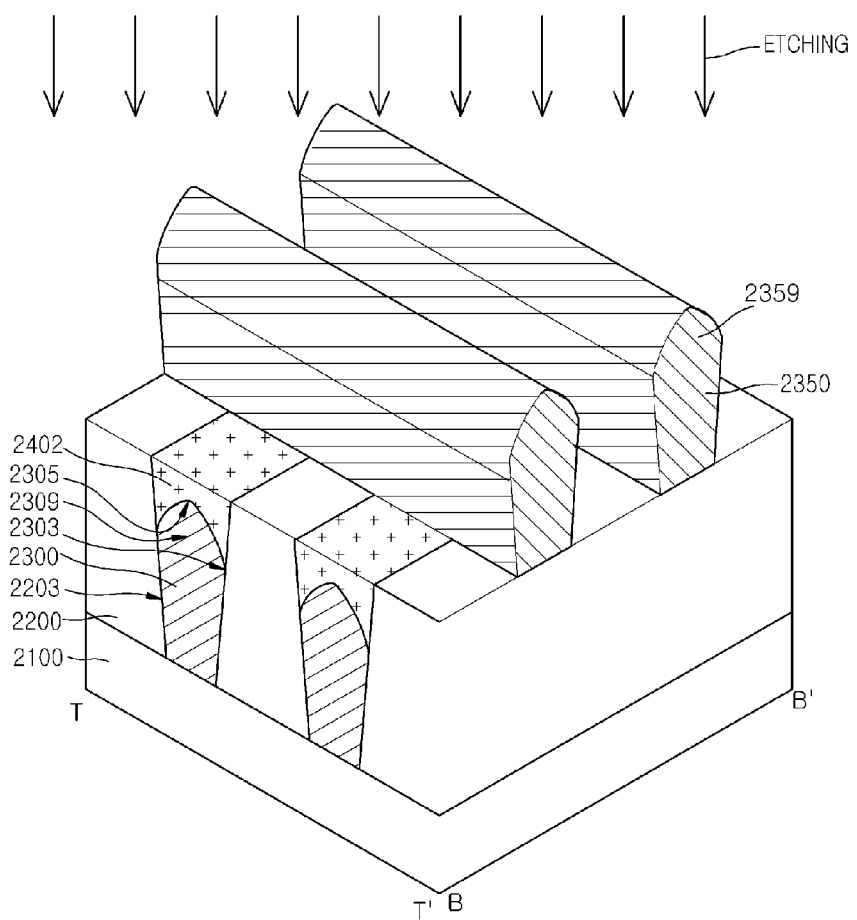
Figure 15:
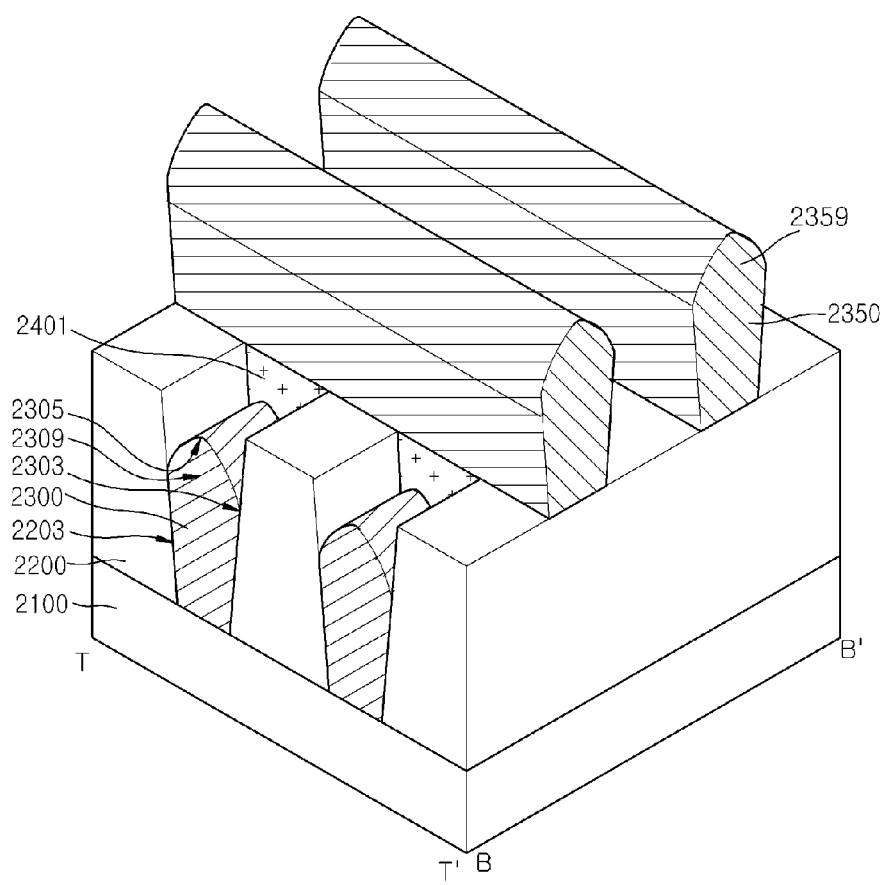
Figure 16:
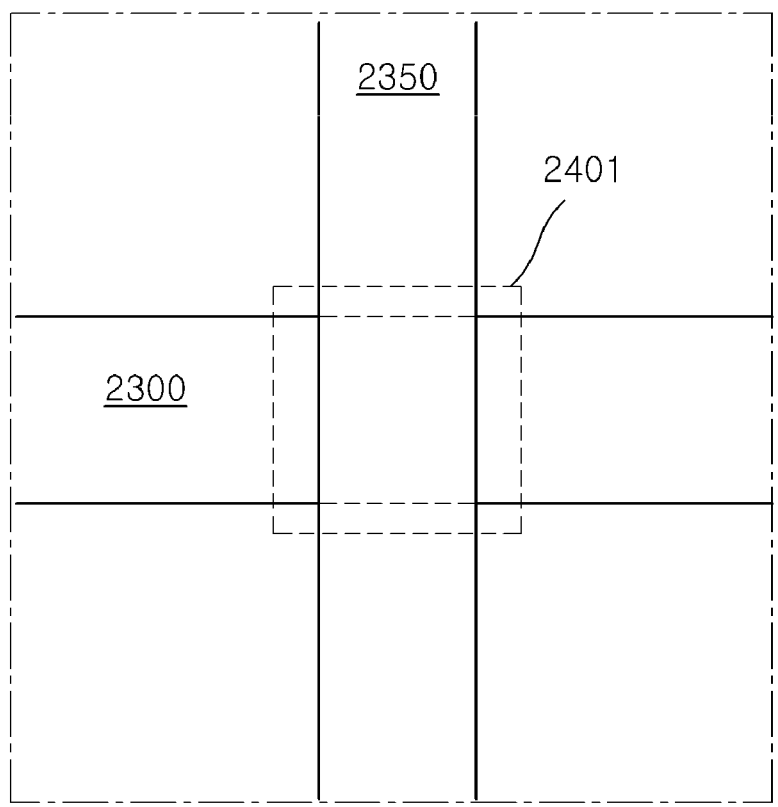
FIG. 16 is a plan view illustrating the nonvolatile memory device shown in FIG. 15.

FIGS. 13, 14, and 15 illustrate a process of manufacturing a nonvolatile memory device according to another embodiment. FIG. 16 is a plan view illustrating the nonvolatile memory device shown in FIG. 15.

Referring to FIG. 13, the initial portion of the process is similar to that described with respect to FIGS. 3 through 6, above. A first dielectric layer 2200 having first trenches 2203 is formed on a semiconductor substrate 2100, and first electrode lines 2300 are formed in the first trenches 2203. An anisotropic etch process, such as a reactive ion etch (RIE) process, is applied to the first electrode lines 2300 to form grooves 2205 in respective ones of the first trenches 2203 by recessing the first electrode lines 2300. During the anisotropic etch process for forming the grooves 2205, edge portions 2303 of upper portions 2309 of the first electrode lines 2300 may be etched faster than central portions 2305 of the upper portions 2309 of the first electrode lines 2300. Thus, the upper portions 2309 of the first electrode lines 2300 may be deformed to have convex top surfaces, and the grooves 2205 having a predetermined depth is formed on the first electrode lines 2300 having the convex top surfaces.

After the initial portion of the process, a memory layer is formed on the first dielectric layer 2200 to fill the grooves 2205, and the memory layer is planarized to form first memory patterns 2402 in respective ones of the grooves 2205. The grooves 2205 may extend in a direction parallel to the first electrode lines 2300. Thus, the first memory patterns 2402 may also be parallel with the first electrode lines 2300 and may be self-aligned with the first electrode lines 2300.

That is, the grooves 2205 may be introduced such that the first memory patterns 2402 are self-aligned with the first electrode lines 2300. However, embodiments are not limited thereto. In some embodiments, the first memory patterns 2402 may be formed parallel with the first electrode lines 2300 by patterning the memory layer with a photolithography process and an etch process instead of a planarization process.

Referring to FIG. 14, a second dielectric layer (not shown) is formed on the first memory patterns 2402 and the first dielectric layer 2200. Second trenches are formed in the second dielectric layer, and second electrode lines 2350 are formed in the second trenches. An anisotropic etch process such as a reactive ion etch (RIE) process is applied to the second dielectric layer using the second electrode lines 2350 as etch masks to expose the first memory patterns 2402. While the anisotropic etch process applied to the second dielectric layer is performed, edge portions of the second electrode lines 2350 may be recessed such that top surfaces of upper portions 2359 of the second electrode lines 2350 have convex shapes.

Referring to FIG. 15, the exposed portions of the first memory patterns 2402 are removed to form second memory patterns 2401. The exposed portions of the first memory patterns 2402 are removed until the first electrode lines 2300 are exposed. Thus, the second memory patterns 2401 are separated from each other. That is, the second memory patterns 2401 may be independently located at cross points of the first and second electrode lines 2300 and 2350, as illustrated in FIG. 16.

Accordingly, the second memory patterns 2401 are spaced apart from each other and have island shapes. Subsequently, a third dielectric layer (not shown) may be formed to cover the first electrode lines 2300, the first dielectric layer 2200, the second memory patterns 2401, and the second electrode lines 2350. The third dielectric layer may electrically insulate the second electrode lines 2350 from each other and may also electrically insulate the second memory patterns 2401 from each other.

Embodiments have been disclosed for illustrative purposes. Those skilled in the art will appreciate that various modifications, additions, and substitutions are possible, without departing from the scope and spirit of the present disclosure and the accompanying claims.

What is claimed is:

1. A nonvolatile memory device comprising:
    a plurality of first electrode lines including upper portions having convex top surfaces;
    a plurality of second electrode lines crossing the plurality of first electrode lines;
    a plurality of memory patterns disposed between the first and second electrode lines; and
    a dielectric layer disposed between the plurality of the first electrode lines and configured to provide edge valleys between the dielectric layer and the upper portions of the plurality of first electrode lines,
    wherein the memory patterns include extension contact portions that fill the edge valleys to contact the upper portions of the first electrode lines.

2. The nonvolatile memory device of claim 1, wherein the memory patterns have line shapes extending parallel to the plurality of second electrode lines.

3. The nonvolatile memory device of claim 1, wherein each of the memory patterns are located at a corresponding one of a plurality of cross points of the first and second electrode lines and are spaced apart from each other.

4. The nonvolatile memory device of claim 1, wherein each of the plurality of first electrode lines has sloped side walls.

5. The nonvolatile memory device of claim 1, wherein each of the plurality of first electrode lines has a lower portion and a upper portion, and
    wherein a line width of the lower portion is less than a line width of the upper portion.

6. The nonvolatile memory device of claim 1, wherein each of the plurality of second electrode lines includes a convex top surface.

7. The nonvolatile memory device of claim 1, wherein each of the plurality of second electrode lines has sloped side walls.

8. The nonvolatile memory device of claim 1, wherein each of the plurality of second electrode lines has a lower portion and a upper portion, and
    wherein a line width of the lower portion is less than a line width of the upper portion.

9. The nonvolatile memory device of claim 1, wherein each of the memory patterns includes a resistance switching material.

10. The nonvolatile memory device of claim 1, wherein each of the memory patterns includes a colossal magneto resistance (CMR) material or a praseodymium calcium manganese oxide ($Pr_{1-x}Ca_xMnO_3$).

11. The nonvolatile memory device of claim 1, wherein each of the memory patterns includes a non-stoichiometric composition of a binary transition metal oxide material.

12. The nonvolatile memory device of claim 11, wherein the binary transition metal oxide material is a niobium oxide, a titanium oxide, a nickel oxide, or an aluminum oxide.

13. The nonvolatile memory device of claim 1, wherein each of the memory patterns includes a chalcogenide material.

14. The nonvolatile memory device of claim 1, wherein each of the memory patterns includes a strontium titanium oxide ($SrTiO_3$) material doped with chromium (Cr) or niobium (Nb) or a strontium zirconium oxide ($SrZrO_3$) material doped with chrome (Cr) or niobium (Nb).

15. The nonvolatile memory device of claim 1, wherein each of the memory pattern includes germanium selenide (GeSe) material doped with silver (Ag).

16. The nonvolatile memory device of claim 1, further comprising selection patterns or tunnel barrier layers disposed between the memory patterns and the first or second electrode lines.

17. The nonvolatile memory device of claim 16, wherein each of the selection patterns includes PN diode or tunnel diode.

18. The nonvolatile memory device of claim 16, wherein each of the tunnel barrier layers includes a titanium oxide ($TiO_2$) layer, a hafnium oxide ($HfO_2$) layer, a tantalum oxide ($Ta_2O_5$) layer, a zirconium oxide ($ZrO_2$) layer or an aluminum oxide ($Al_2O_3$) layer.

19. The nonvolatile memory device of claim 1, wherein the first electrode lines or the second electrode lines include a tungsten (W) material or a copper (Cu) material.

* * * * *